United States Patent
Ruggiero et al.

(10) Patent No.: US 11,450,516 B2
(45) Date of Patent: Sep. 20, 2022

(54) LARGE-GRAIN TIN SPUTTERING TARGET

(71) Applicant: Honeywell International Inc., Morris Plains, NJ (US)

(72) Inventors: Marc D. Ruggiero, Spokane Valley, WA (US); Stephane Ferrasse, Spokane, WA (US); Frank C. Alford, Spokane Valley, WA (US); Susan D. Strothers, Mead, WA (US); Patrick K. Underwood, Spokane, WA (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/985,998

(22) Filed: Aug. 5, 2020

(65) Prior Publication Data

US 2021/0050194 A1 Feb. 18, 2021

Related U.S. Application Data (60) Provisional application No. 62/886,747, filed on Aug. 14, 2019.

(51) Int. Cl.
*H01J 37/34* (2006.01)
*C23C 14/14* (2006.01)
*C23C 14/34* (2006.01)

(52) U.S. Cl.
CPC .......... *H01J 37/3426* (2013.01); *C23C 14/14* (2013.01); *C23C 14/3414* (2013.01); *H01J 37/3423* (2013.01); *H01J 37/3491* (2013.01)

(58) Field of Classification Search
CPC .................. C23C 14/3414; H01J 37/3426
See application file for complete search history.

(56) References Cited

U.S. PATENT DOCUMENTS

| | | | |
|---|---|---|---|
| 3,727,666 A * | 4/1973 | Vander Sluis | B22C 3/00 164/72 |
| 7,547,367 B2 * | 6/2009 | Suortti | B22D 27/045 148/100 |
| 9,334,564 B2 | 5/2016 | Simons et al. | |
| 9,761,421 B2 | 9/2017 | Endo et al. | |
| 9,982,335 B2 | 5/2018 | Sakurai et al. | |

(Continued)

FOREIGN PATENT DOCUMENTS

| | | | |
|---|---|---|---|
| EP | 0768387 A1 * | 4/1997 | ........ H01J 37/3423 |
| EP | 1186682 A2 | 3/2002 | |
| KR | 10-2008-0049072 A | 6/2008 | |

OTHER PUBLICATIONS

Translation to Schlott (EP 0768 387) published Apr. 1997.*

(Continued)

*Primary Examiner* — John J Brayton
(74) *Attorney, Agent, or Firm* — Faegre Drinker Biddle & Reath LLP (57) ABSTRACT

The present disclosure relates generally to a planar sputtering target. In particular, the present disclosure provides a planar sputtering target comprising a planar sputtering surface and a back surface opposite the planar sputtering surface. The planar sputtering target is formed from a 2N purity tin having an average grain size from at least 10 mm to at most 100 mm. The present disclosure provides a method of manufacturing the tin planar sputtering target having an average grain size from at least 10 mm to at most 100 mm.

20 Claims, 7 Drawing Sheets

(56) References Cited

U.S. PATENT DOCUMENTS

| | | | |
|---|---|---|---|
| 2007/0089815 A1* | 4/2007 | Wickersham | C22C 27/02 |
| | | | 148/668 |
| 2007/0215463 A1* | 9/2007 | Parkhe | C23C 14/3414 |
| | | | 204/298.12 |
| 2010/0065425 A1* | 3/2010 | Matsuzaki | C22C 5/06 |
| | | | 204/298.13 |
| 2010/0129011 A1* | 5/2010 | Suga | C22C 9/02 |
| | | | 384/26 |
| 2013/0264200 A1 | 10/2013 | Schlott et al. | |
| 2014/0332404 A1* | 11/2014 | Shindo | C22F 1/16 |
| | | | 205/723 |
| 2017/0009362 A1* | 1/2017 | Werner | C07F 7/2224 |
| 2017/0062193 A1* | 3/2017 | Schultheis | H01J 37/3414 |
| 2019/0040498 A1 | 2/2019 | Oishi | |

OTHER PUBLICATIONS

International Search Report and Written Opinion received for PCT Patent Application No. PCT/US2020/046070, dated Nov. 17, 2020, 9 pages.

* cited by examiner

LARGE-GRAIN TIN SPUTTERING TARGET

CROSS-REFERENCE TO RELATED APPLICATION

This application claims priority to U.S. Provisional Application No. 62/886,747, filed Aug. 14, 2019, which is herein incorporated by reference in its entirety.

TECHNICAL FIELD

The field of the subject matter is the design and use of sputtering systems including tin (Sn) sputtering targets having an average grain size greater than 10 mm.

BACKGROUND

Sputtering targets are useful, for example, in the manufacture of electronic and semiconductor components, glass coatings, and solar cell coatings to form metallized layers during fabrication. Thin film deposition using tin sputtering targets having small grain sizes are known in semiconductor, chemical vapor deposition (CVD), physical vapor deposition (PVD), display and optical applications.

Figure 1:
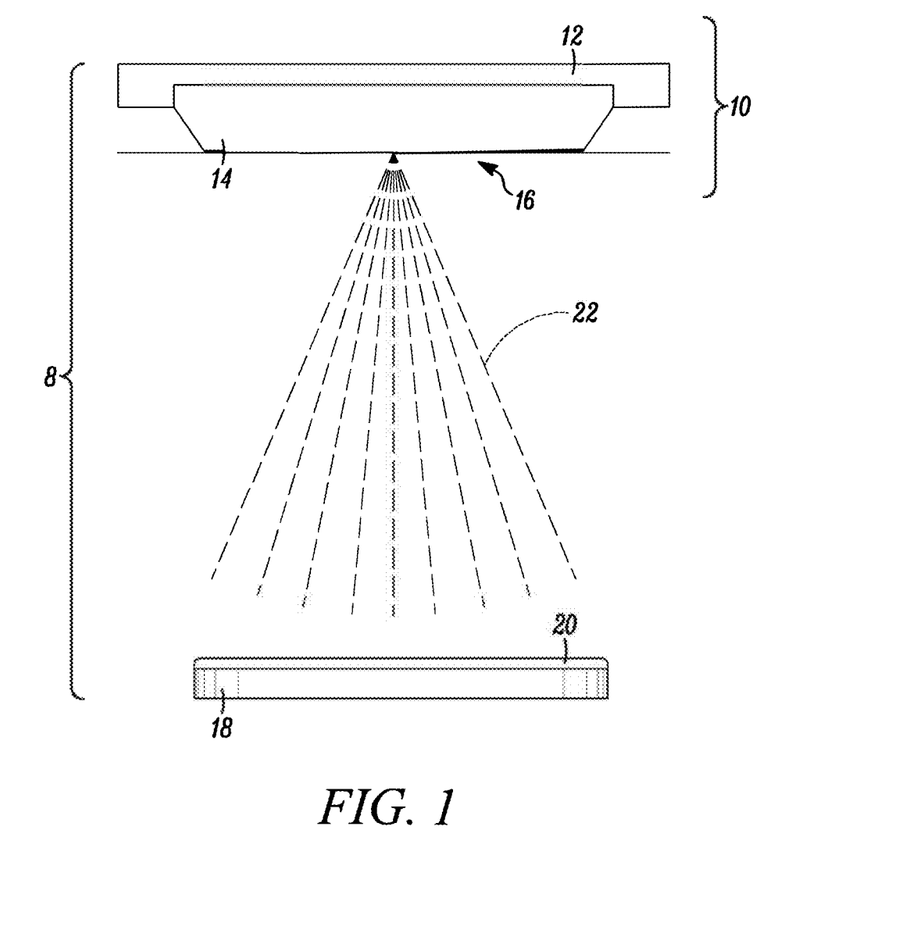
FIG. 1 is a schematic view of a portion of a physical vapor deposition apparatus.

Sputter deposition is a PVD method in which a glow plasma discharge bombards a sputtering target which releases atoms that are subsequently deposited onto a substrate. A diagrammatic view of a portion of an exemplary sputter deposition apparatus 8 is shown in FIG. 1. In one configuration, a sputtering target assembly 10 comprises a backing plate 12 having a target 14 bonded thereto. A substrate 18 such as a semiconductive material wafer is within the sputter deposition apparatus 8 and provided to be spaced from the target 14. As shown, the target 14 is disposed above the substrate 18 and is positioned such that a sputtering surface 16 faces substrate 18.

In operation, sputtered material 22 is displaced from the surface 16 of target 14 and forms a thin film 20 on substrate 18. In some embodiments, suitable substrates 18 include wafers used in semiconductor fabrication. For example, the target 14 is bombarded with energy until atoms from the surface 16 are released into the surrounding atmosphere and subsequently deposited on substrate 18. In some embodiments, plasma sputtering is used to deposit a thin metal film onto wafers for use in electronics.

Grain sizes of tin sputtering targets are typically in the micron range, i.e., from submicron to hundreds of microns. Target grain size can affect deposition rate and erosion rate. Tin (Sn) targets having large grain sizes, e.g., above 10 mm, have not been previously known.

SUMMARY

These and other needs are addressed by the various aspects and configurations of the present disclosure.

Various aspects of the present disclosure include a planar sputtering target including a planar sputtering surface and a back surface opposite the planar sputtering surface, wherein the planar sputtering target is formed from a 2N purity tin having an average grain size from at least 10 mm to at most 100 mm.

The planar sputtering target described herein above, wherein the average grain size is from at least 20 mm to at most 50 mm.

The planar sputtering target(s) described herein above, wherein the average grain size is uniformly distributed.

The planar sputtering target(s) described herein above, wherein the tin is a high purity tin having an impurity content of at most 15 ppm.

The planar sputtering target(s) described herein above having an impurity content of at most 10 ppm.

The planar sputtering target(s) described herein above, wherein the tin is a high purity tin having an alpha count of less than 0.01 cph/cm$^2$.

Various aspects of the present disclosure include a method of manufacturing the planar sputtering target described herein above, the method including: (a) casting molten tin of at least 2N purity; (b) thermomechanical processing the cast tin to form a thermomechanically processed tin; and (c) heat treating the thermomechanically processed tin at a temperature of from at least 175° C. to at most 225° C. for a time of from at least 2 hours to at most 48 hours to form a planar sputtering target having an average grain size from at least 10 mm to at most 100 mm.

The method of manufacturing the planar sputtering target described herein above, wherein the step of casting molten tin includes having a crucible temperature of from about 235° C. to about 350° C. for about one hour followed by pouring the molten tin into a mold to form a near net casting.

The method(s) of manufacturing the planar sputtering target described herein above, wherein the mold is preheated to a temperature of from about 250° C. to about 375° C. for a time of about 30 minutes.

The method(s) of manufacturing the planar sputtering target described herein above, wherein the step of pouring the molten tin into the mold is followed by slow cooling at a rate of 250° C. per hour or less.

The method(s) of manufacturing the planar sputtering target described herein above, wherein the near net casting is sized to a diameter from about 150 mm to about 600 mm and to a thickness from about 20 mm to about 69 mm.

The method(s) of manufacturing the planar sputtering target described herein above, wherein the step of thermomechanically processing the near net casting includes cross-rolling reduction from about 5% to about 15%.

The method(s) of manufacturing the planar sputtering target described herein above, wherein the step of thermomechanically processing is performed by a method other than rolling such as forging, extrusion, ECAE/ECAP, torsion, RCS, and variants thereof.

The method(s) of manufacturing the planar sputtering target described herein above, wherein the step of heat treating the thermomechanically processed tin is at a temperature of from at about 200° C. for a time of about 24 hours.

The method(s) of manufacturing the planar sputtering target described herein above, wherein the step of heat treating the thermomechanically processed tin is at a temperature of from at about 200° C. for a time of about 4 hours.

The method(s) of manufacturing the planar sputtering target described herein above, wherein the step of casting molten tin forms a billet followed by slicing the billet to form a plurality of blanks.

The method(s) of manufacturing the planar sputtering target described herein above, wherein the billet is sized to a diameter of about 171 mm (6.75 inches) and to a height of about 457 mm (18 inches).

The method(s) of manufacturing the planar sputtering target described herein above, wherein the step of thermomechanically processing the billet includes individually thermomechanically processing the plurality of blanks by cross-rolling reduction by at least 50%.

The method(s) of manufacturing the planar sputtering target described herein above, wherein the step of thermomechanically processing the billet includes individually thermomechanically processing the plurality of blanks by cross-rolling reduction by at least 60% to at most 80%.

The method(s) of manufacturing the planar sputtering target described herein above, wherein the step of thermomechanically processing the billet is performed by a method other than rolling such as forging, extrusion, ECAE/ECAP, torsion, RCS, and variants thereof.

The method(s) of manufacturing the planar sputtering target described herein above, wherein the step of heat treating is at a temperature of about 200° C. for a time of about 24 hours.

The method(s) of manufacturing the planar sputtering target described herein above, wherein the step of heat treating the thermomechanically processed tin is at a temperature of from at about 200° C. for a time of about 4 hours.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

The present disclosure relates generally to tin (Sn) sputtering targets for use in thin film technologies. In particular, the present disclosure provides a planar sputtering target comprising tin and having an average grain size of at least 10 mm and at most 100 mm. The present disclosure addresses the need to tailor the microstructure of the sputtering target by providing a combination of thermomechanical processes. Thus, planar tin sputtering targets may be achieved having an average grain size from about 10 mm to about 100 mm.

Figure 2:
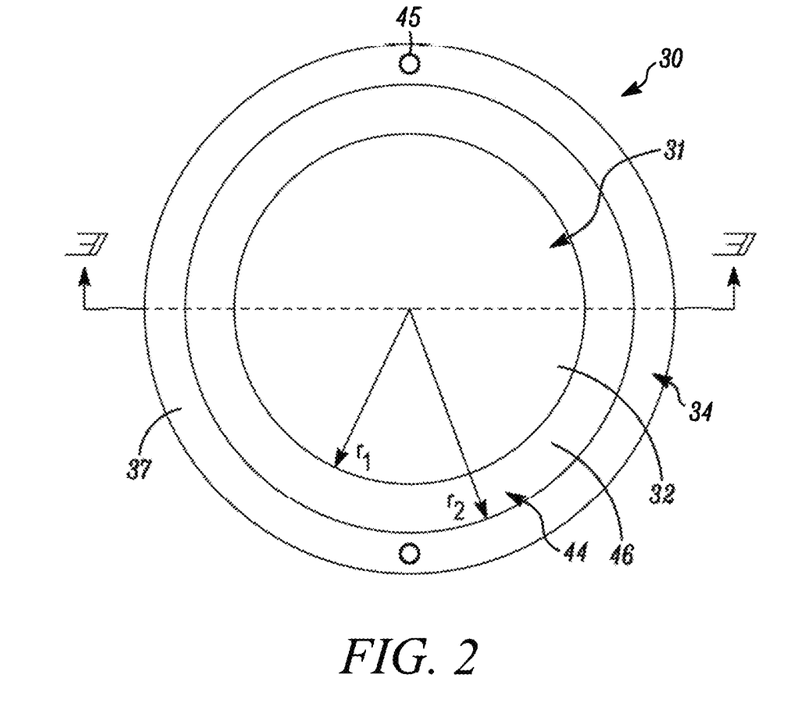
FIG. 2 is a schematic, top view of an exemplary sputtering target assembly.
Figure 3:
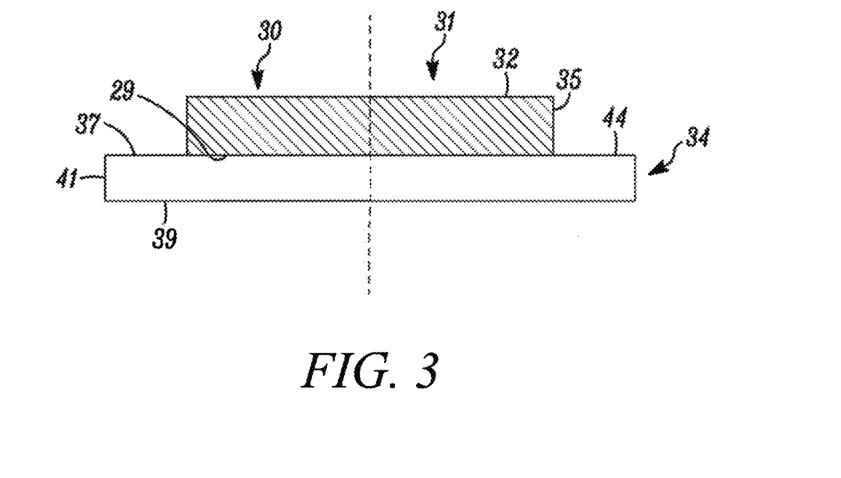
FIG. 3 is a schematic, cross-sectional view along the line 3-3 of FIG. 2.

Various aspects of the present disclosure include a planar sputtering target 31 in a top view of a sputtering target assembly 30 as shown in FIG. 2. FIG. 3 is a cross-sectional view of sputtering target assembly 30 taken along line 3-3 of FIG. 2. Sputtering target assembly 30 includes a sputtering target 31 and a backing plate 34. In some embodiments, sputtering target 31 and backing plate 34 having circular or substantially circular cross-sectional shape in the top view. In use, backing plate 34 is connected to the sputter deposition apparatus, for example, by bolts or clamps.

Sputtering target 31 has a front or sputtering surface 32, a back surface 29 opposite the sputtering surface 32, and a sidewall 35 extending between the sputtering surface 32 and the back surface about the circumference of sputtering target 31. In some embodiments, the sputtering surface 32 may be generally flat or planar, also referred to herein as planar sputtering surface 32. For example, the sputtering surface 32 may be parallel to a horizontal first plane. In other embodiments, the sputtering surface 32 may have one or more convex or concave portions or features. Back surface 29 is opposite the sputtering surface 32. Additionally or alternatively, the back surface of the sputtering target 31 may be substantially planar. Alternatively, the back surface may have protrusions or indentations. For example, the back surface may receive or be received within a portion of backing plate 34, a design which is known as an embedded backing plate. Sputtering target 31 may be formed from any metal suitable for PVD deposition processes or other processes suitable for use with the sputtering target according to the present disclosure. In some embodiments, sputtering target 31 is formed of tin (Sn).

Backing plate 34 has front surface 37, back surface 39 opposite front surface 37, and sidewall 41 extending from front surface 37 to back surface 39 about the outer circumference of backing plate 34. The back surface of sputtering target 31 is adjacent and bonded to front surface 37 of backing plate 34. The radius of backing plate 34 is larger than that of sputtering target 31 such that at least a portion of the backing plate 34, referred to as flange 44, extends radially outward from the outer diameter or radial edge of the sputtering target 31. The backing plate 34 and sputtering target 31 may be separate pieces which are bonded together. In such embodiments, the backing plate 34 may be formed of the same or different material than the sputtering target 31.

Flange 44, which extends radially outward from sputtering target 31, may be substantially flat or planar and include flange surface 46. In some embodiments, the exposed portion of front surface 37 may be parallel or substantially parallel to the horizontal plane. In other embodiments, the exposed portion of front surface 37 may be in a plane at an angle to the first plane. Flange 44 can include one or more counter bore holes or/and through-holes 45 for connecting or bolting backing plate 34 to the sputter deposition source or apparatus.

Backing plate 34 may be formed from any suitable metal. For example, backing plate 34 may include aluminum (Al), vanadium (V), niobium (Nb), copper (Cu), titanium (Ti), zirconium (Zr), molybdenum (Mo), and alloys and combinations thereof. For example, alloys include an Al alloy, a V alloy, a Nb alloy, a Cu alloy, a Ti alloy, a Zr alloy, and a Mo alloy. Suitable alloys include but are not limited to copper-chromium (CuCr) alloy, copper-zinc (CuZn) alloy, copper-chromium-nickel-silicon (CuCrNiSi) alloys such as C18000 alloys, commercial aluminum alloys such as Al 6061 and Al 2024 alloys.

While sputtering assembly 30 including sputtering target 31 may be used in a sputter deposition apparatus, such as apparatus 8 as shown in FIG. 1, it is contemplated that the sputtering target 31 is useful in other applications in addition to physical vapor deposition (PVD) including, but not limited to, semiconductor, chemical vapor deposition (CVD), display and optical applications.

As discussed herein, sputtering target 31 is planar and includes a planar sputtering target surface 32 and back surface 29 opposite the sputtering surface 32 and a bulk portion therebetween. The planar sputtering target 31 is formed from at least a 2N purity tin having an average grain size from at least 10 mm to at most 100 mm. The bulk portion of target 31 between sputtering target surface 32 and back surface 29 may also include the surfaces 32 and 29. Planar sputtering target 31 is characterized as having an average grain size from at least 10 mm to at most 100 mm. In some embodiments, planar sputtering target 31 is characterized in the bulk portion as having an average grain size from at least 10 mm to at most 100 mm. In some embodiments, the planar sputtering target 31 has an average grain size from at least 20 mm to at most 50 mm. In some embodiments, the average grain size is uniformly distributed.

The purity of the tin target may be of any level suitable for use. In some embodiments, the tin purity is 2N (99%), or 3N (99.9%), or 4N (99.99%), or 5N (99.999%). In some embodiments, the tin of planar sputtering target 31 is a high purity tin having an impurity content of at most 50 ppm. In some embodiments, the impurity content is at most 15 ppm. In some embodiments, the impurity content is at most 10 ppm (5N).

The tin may be low-alpha or non-low-alpha. In some embodiments, the tin is low alpha having an alpha count of less than 0.01 cph/cm$^2$. In some embodiments, the tin is ultra low alpha having an alpha count of less than 0.002 cph/cm$^2$. In some embodiments, the tin is super ultra low alpha having an alpha count of less than 0.001 cph/cm$^2$.

The planar sputtering target 31 having an average grain size from at least 10 mm to at most 100 mm according to the present disclosure may be formed using the following methods of manufacture. In some embodiments, the average grain size of the planar sputtering target 31 is at least 20 mm to at most 50 mm.

Figure 4:
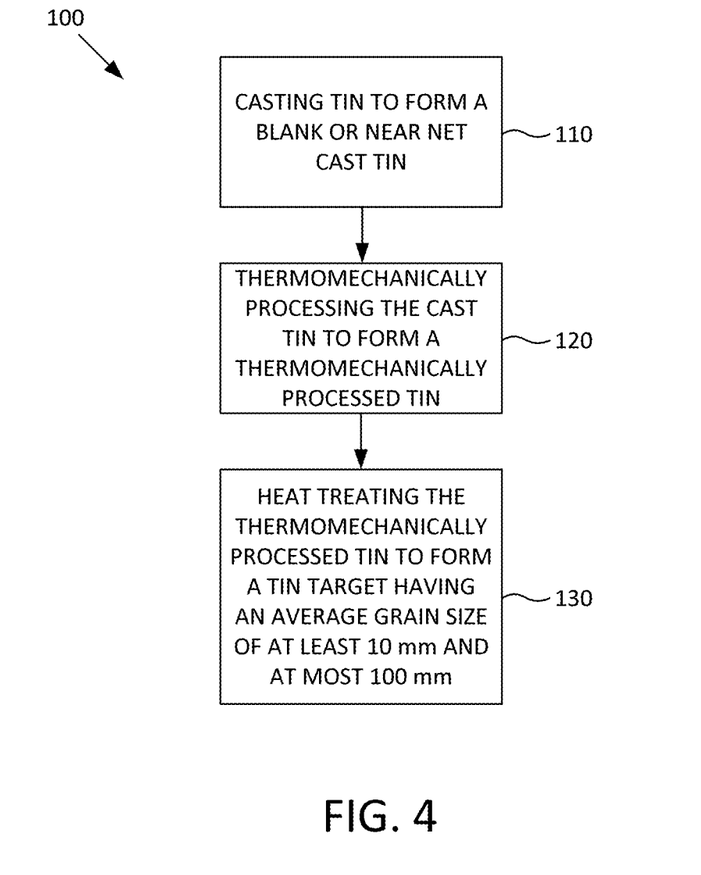
FIG. 4 is a flow chart illustrating a method for making the planar sputtering target having an average grain size from about 10 mm to about 100 mm according to the present disclosure.

In a first aspect, a method 100 for making the planar sputtering target according to the present disclosure includes, as shown in FIG. 4, steps 110, 120, and 130. As in step 110, a target blank is formed by casting molten tin (at a temperature above the melting point of 232° C.) and pouring into a mold. Step 110 including casting molten tin may further include having a crucible temperature of from about 235° C. to about 350° C. for a time of about one hour followed by pouring the molten tin into a mold preheated to a temperature of from about 250° C. to about 375° C. for a time of about 30 minutes to form a near net casting. In some embodiments, the crucible temperature is about 300° C. In some embodiments, the mold is preheated to about 320° C. In some embodiments, step 110 including pouring the molten tin into the mold is followed by slow cooling at a rate of 250° C. per hour or less. In some embodiments, step 110 may optionally include water flow on a cooling table. In some embodiments, the cast tin is a near net casting and may be sized to a diameter from about 150 mm to about 600 mm and to a thickness from about 20 mm to about 69 mm. In an example, the mold is 270 mm diameter by 20 mm in height. In other embodiments, the near net casting and mold are together re-heated to a temperature of from about 250° C. to about 400° C. followed by gradual cooling at a rate of 250° C. per hour or less in order to reduce shrink cavities and provide a more uniform microstructure for the near net casting.

Figure 5:
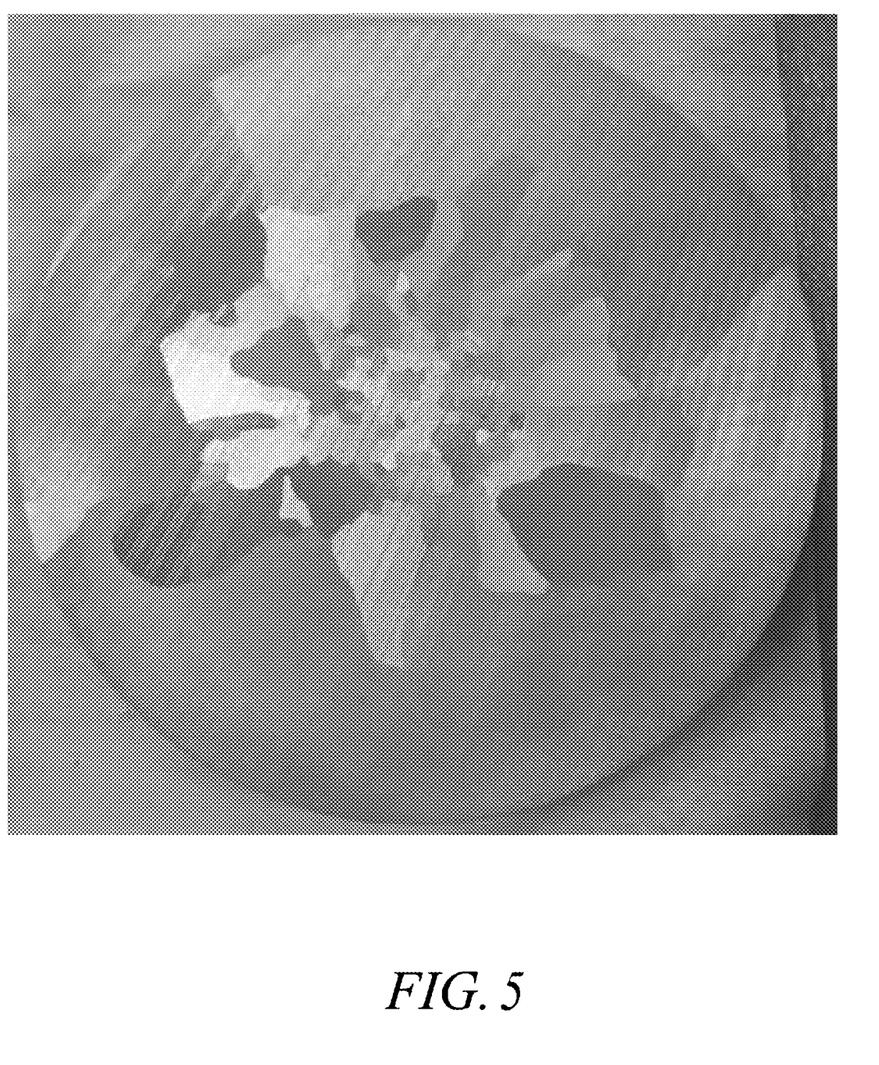
FIG. 5 is an image of an as cast tin sample having a non-uniform grain size.

In other embodiments, the step of casting molten tin as in step 110 may include forming a billet that is followed by slicing the billet to form a plurality of blanks or slices. In these or other embodiments, the billet is sized to a diameter of about 171 mm (6.75 inches) and to a height of about 457 mm (18 inches). As poured, the billet demonstrates non-uniform grain size as shown in FIG. 5. As cast billet may have non-uniform grain sizes from about 1 mm to about 250 mm. Thermomechanical processing is needed to provide a uniform grain size distribution of the tin grains.

As in step 120, referring again to FIG. 4, the cast tin is thermomechanically processed to form a thermomechanically processed tin as may be accomplished by reduction by rolling. The percentage of reduction may vary according to casting procedure. Step 120 including thermomechanically processing for near net casting may include a small cross-rolling reduction from about 5% to about 15%. For slices or blanks from a cast billet, at least about 50% rolling reduction is more suitable. In these or other embodiments, step 120 of thermomechanically processing the billet includes individually thermomechanically processing the plurality of blanks by cross-rolling reduction by at least 50%. In some embodiments, the plurality of blanks may be individually thermomechanically processed by cross-rolling reduction by at least 60% and at most 80%. Embodiments of the present disclosure are not limited to thermomechanical processing by cross-rolling reduction. Any other thermomechanical processing technique that can impart the range of deformation described above (as defined by % thickness reduction or equivalent true strain) in a tin material may be used. In addition to cross-rolling reduction, examples of thermomechanical processing techniques suitable in the present disclosure include forging, drawing, extrusion, ECAE/ECAP, cyclic extrusion, repetitive corrugation and straightening (RCS), torsion, and variants thereof and including variants of cross-rolling such as asymmetric rolling.

As in step 130, referring again to FIG. 4, the thermomechanically processed tin is heat treated at a temperature of from at least 175° C. to at most 225° C. for a time of from at least 2 hours to at most 48 hours. In some embodiments, the thermomechanically processed tin is heat treated at a temperature of about 200° C. for a time of about 24 hours, or at a temperature of about 200° C. for a time of about 12 hours, or at a temperature of about 200° C. for a time of about 4 hours. In some embodiments, the thermomechanically processed tin may be heat treated at a first temperature of from at least 175° C. to at most 225° C. for a first time from at least 2 hours to at most 48 hours, and subsequently heat treated at a second temperature of from at least 175° C. to at most 225° C. for a second time from at least 2 hours to at most 48 hours. The temperature range from about 150° C. to up to 175° C. is strategically avoided in order to avoid the temperature range at which explosive growth of some grains takes place wherein a bimodal distribution of grain size provides grains that are too small and other that are too big.

EXAMPLES

Example 1: Small scale sample. A billet of tin was cast using a crucible temperature of 300° C. and sliced into samples sized to about 5 cm×5 cm×1 cm. The samples were then thermomechanically processed by cross rolling at a reduction of 25%, 50%, and 75% using a rolling mill [FENN, 10 inch diameter roll, 12 inch width] and the average grain size was determined visually, by using an optical microscope [Nikon Epiphot equipped with a Clemex Vision PE 4.0 image analytic analytical tool for average grain size determination], and by using ASTM grain size sizing templates as described in ASTM method E112. Cross-sectional samples were mechanically polished using 120 grit, then electropolished and electro-etched to enhance visibility of grain boundaries.

It was found that mechanical polishing induced dynamic recrystallization and created a thin layer of small grains at the surface due to low thermal stability of high purity Sn; therefore, electropolishing was used to remove the surface layer created by the mechanical polishing. The combination of techniques of mechanical polishing (120 grit) followed by electropolishing revealed grain size of the bulk microstructure underneath the surface.

Samples thermomechanically reduced by cross rolling at 25%, 50%, and 75% (Samples 1-H, 2-H, and 3-H, respectively) were heat treated at temperatures ranging from 50° C. to 225° C. to determine the effect of heat treatment on average grain size. The effect of heat treatment on average grain size is shown in Table 1.

TABLE 1

| % Rolling | As Rolled | 50° C. | 75° C. | 100° C. | 125° C. | 150° C. | 175° C. | 200° C. | 225° C. |
|---|---|---|---|---|---|---|---|---|---|
| | | | | Average grain size (μm) | | | | | |
| 25 1-H | 353 | — | 361 | 378 | 455 | 539 | 428* | >1000, <20,000 | >1000, <20,000 |
| 50 2-H | 281 | 274 | — | 316 | — | 373* | — | — | — |
| 75 3-H | — | — | — | — | — | — | — | — | >1000, <20,000 |

*Abnormal

Samples 1-H at 175° C. and 2-H at 150° C. demonstrated abnormal grain growth meaning that at least some of the grains were non-uniformly larger than average. This was generally observed for samples heat treated at temperatures starting from about 150° C. to about 175° C. At temperatures above 175° C. and especially above 200° C., grain size was larger but more uniform because all grains with favorable orientation had time to grow significantly to a similar size (generally above 1 mm). For samples cross-rolled at 25% and 75% reduction, heat treated at 225° C. for 2 hours, grain sizes were observed that were less than 20,000 μm (20 mm) in diameter with a range between 1 mm and 20 mm. Samples cross-rolled at 75% reduction and heat treated at 225° C. for 4 hours and 20 hours demonstrated an average grain size of about 4,500 μm and 4,500 μm-5,000 μm, respectively. It was surprisingly observed that long term heat treatments (up to 20 hours) at 225° C. did not produce grain growth to average grain sizes above 20,000 μm (20 mm). Without being bound by theory, it is believed that a potential reason is that the relatively small sample dimensions (5 cm×5 cm×1 cm) may have impeded large grain growth. The next examples involve samples of a larger scale.

As will be shown in Examples 2 and 3, samples exhibiting a target average grain size from 10 mm to 50 mm were achieved by either near net casting or casting billets, the casting billets being then sliced into blanks 200 mm in diameter. In both casting instances, thermomechanical processing was necessary to make grains uniform in size prior to heat treatment.

Figure 6:
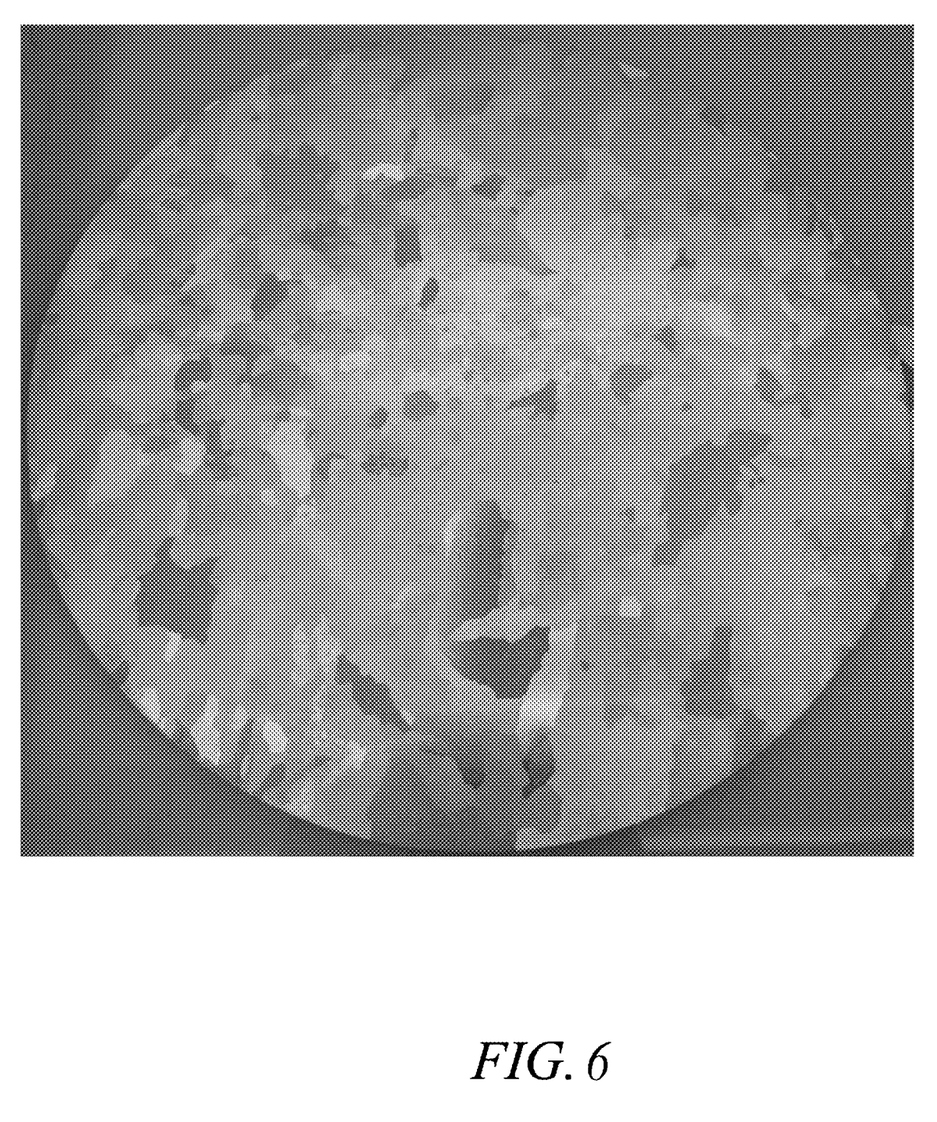
FIG. 6 is an illustrative image of a near net cast tin target sample having a uniform average grain size of about 20 mm according to the present disclosure.

Example 2: Near Net Casting. A target blank was formed by casting molten tin (at a temperature above the melting point of 232° C.) and pouring into a mold. Crucible temperature of about 300° C. was applied for about one hour followed by pouring the molten tin into a mold preheated to about 320° C. for about 30 minutes to form a near net casting. The piece was allowed to cool to room temperature and then was heated in an oven for 2.5 hours at 300° C. followed by gradual step cooling, first at 250° C. for 1 hour followed by slow cooling at a rate of about 50° C. per hour. This resulted in a near net shape casting with no shrink cavity and a fairly uniform average grain size of around 110 mm. The near net casting was then cross-rolled with a 5% total thickness reduction and heat treated at 150° C. for 4 hours followed by a second heat treatment at 200° C. for 4 hours. As shown in Table 2 and in FIG. 6, the average grain size was about 20.3 mm.

TABLE 2

| Location | Grain Size (mm) |
|---|---|
| 1 | 39 |
| 2 | 22 |
| 3 | 26 |
| 4 | 15.5 |
| 5 | 18.5 |
| 6 | 29 |
| 7 | 21 |
| 8 | 15 |
| 9 | 17 |
| 10 | 19 |
| 11 | 20 |
| 12 | 22.5 |
| 13 | 12.5 |
| 14 | 12.5 |
| 15 | 19 |
| 16 | 17 |
| Average | 20.3 |

Figure 7:
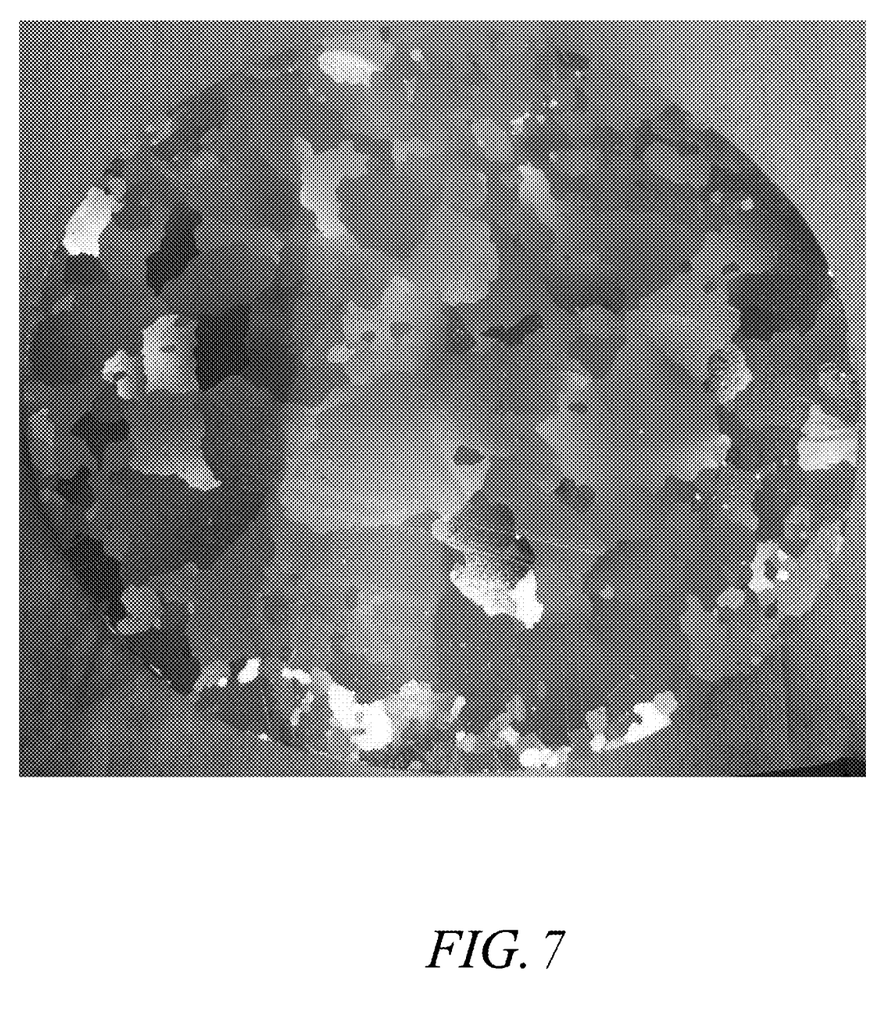
FIG. 7 is an illustrative image of a billet cast tin target sample having a uniform average grain size from about 20 mm to about 50 mm according to the present disclosure

Example 3: Billet Casting. A tall billet was cast with a diameter of about 171 mm (6.75 inches) and a height of about 457 mm (18 inches). Crucible temperature was 300° C. and the mold was preheated at 320° C. Several slices were cut along the billet thickness, the slices each having a diameter of about 171 mm (6.75 inches) and a thickness of about 25.4 mm (1 inch). As shown in FIG. 5, the as cast grain size is non-uniform. One slice from at top of billet (referred as "Top slice") and one from the central part of billet (referred as "bulk slice") were cross-rolled with about 67% total reduction. Heat treatments were performed at 150° C. for 4 hours followed by 200° C. for 4 hours. As shown in FIG. 7 and corresponding to the average grain size data in Table 3, an average grain size from about 20 mm to about 50 mm is exhibited.

TABLE 3

| Sample # | Average Grain Size (mm) (Top Slice) | Average Grain Size (mm) (Bulk Slice) |
| --- | --- | --- |
| 1 | 59 | 28 |
| 2 | 46 | 16 |
| 3 | 95 | 47 |
| 4 | 62 | 19 |
| 5 | 31 | 53 |
| 6 | 41 | 78 |
| 7 | 20 | 43 |
| 8 | 34 | 11 |
| 9 | 19 | 34 |
| 10 | 39 | 18 |
| 11 | 22 | 23 |
| 12 | 33 | 21 |
| 13 | 16 | 54 |
| 14 | 13 | 36 |
| 15 | 73 | 18 |
| Average | 40 | 33 |

Figure 8:
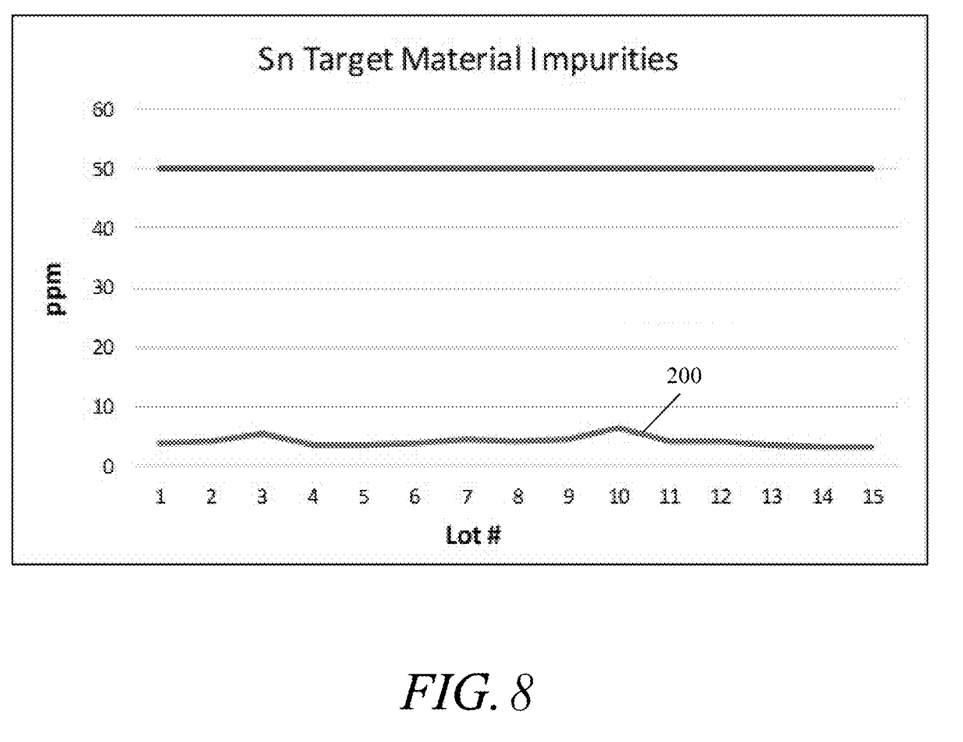
FIG. 8 is an illustrative plot showing the impurity content as less than 10 ppm for a tin target according to the present disclosure.

The purity of the material provided for the samples according to Table 3 was high with impurity content below 10 ppm as shown in plot 200 as in FIG. 8. After heat treatment, blank targets were bonded to a backing plate and the target was cleaned prior to use.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A method of manufacturing a planar sputtering target having a planar sputtering surface, and a back surface opposite the planar sputtering surface, wherein the planar sputtering target is formed from tin having a purity of at least 2N and an average grain size from at least 10 mm to at most 100 mm, and a maximum grain size to a mean grain size ratio from 1.9 to 2.4 the method consisting of the steps:
    casting molten tin of at least 2N purity;
    thermomechanical processing the cast tin to form a thermomechanically processed tin; and
    heat treating the thermomechanically processed tin at a temperature of from at least 175° C. to at most 225° C. for a time of from at least 2 hours to at most 48 hours to form the planar sputtering target having the average grain size from at least 10 mm to at most 100 mm, and a maximum grain size to a mean grain size ratio from 1.9 to 2.4.

2. The method of claim 1, wherein the step of casting molten tin includes having a crucible temperature of from about 235° C. to about 350° C. for about one hour followed by pouring the molten tin into a mold to form a near net casting.

3. The method of claim 2, wherein the mold is preheated to a temperature of from about 250° C. to about 375° C. for a time of about 30 minutes.

4. The method of claim 2, wherein the step of pouring the molten tin into the mold is followed by slow cooling at a rate of 250° C. per hour or less.

5. The method of claim 2, wherein the near net casting is sized to a diameter from about 150 mm to about 600 mm and to a thickness from about 20 mm to about 69 mm.

6. The method of claim 2, wherein the step of thermomechanically processing the near net casting includes cross-rolling reduction from about 5% to about 15%.

7. The method of claim 2, wherein the step of thermomechanically processing is performed by a method other than rolling such as forging, extrusion, ECAE/ECAP, torsion, RCS, and variants thereof.

8. The method of claim 2, wherein the step of heat treating the thermomechanically processed tin is at a temperature of from at about 200° C. for a time of about 4 hours.

9. The method of claim 1, wherein the step of casting molten tin forms a billet followed by slicing the billet to form a plurality of blanks.

10. The method of claim 9, wherein the billet is sized to a diameter of about 171 mm (6.75 inches) and to a height of about 457 mm (18 inches).

11. The method of claim 9, wherein the step of thermomechanically processing the billet includes individually thermomechanically processing the plurality of blanks by cross-rolling reduction by at least 50%.

12. The method of claim 11, wherein the step of thermomechanically processing the billet includes individually thermomechanically processing the plurality of blanks by cross-rolling reduction by at least 60% to at most 80%.

13. The method of claim 9, wherein the step of thermomechanically processing the billet is performed by a method other than rolling such as forging, extrusion, ECAE/ECAP, torsion, RCS, and variants thereof.

14. The method of claim 9, wherein the step of heat treating the thermomechanically processed tin is at a temperature of from at about 200° C. for a time of about 4 hours.

15. A planar sputtering target comprising:
    a planar sputtering surface; and,
    a back surface opposite the planar sputtering surface;
    wherein the planar sputtering target is formed from tin having a purity of at least 2N, an average grain size from at least 10 mm to at most 100 mm, and a maximum grain size to minimum grain size ratio from 3.1 to 7.3.

16. The planar sputtering target of claim 15, wherein the tin is a high purity tin having an impurity content of at most 15 ppm.

17. The planar sputtering target of claim 15, wherein the tin is a high purity tin having an alpha count of less than 0.01 cph/cm$^2$.

18. A planar sputtering target comprising:
    a planar sputtering surface; and,
    a back surface opposite the planar sputtering surface;
    wherein the planar sputtering target is formed from tin having a purity of at least 2N, an average grain size from at least 10 mm to at most 100 mm, and a grain size standard deviation to mean grain size ratio from 0.3 to 0.6.

19. The planar sputtering target of claim 18, wherein the tin is a high purity tin having an impurity content of at most 15 ppm.

20. The planar sputtering target of claim 18, wherein the tin is a high purity tin having an alpha count of less than 0.01 cph/cm$^2$.

* * * * *